United States Patent
Sarraf

(10) Patent No.: US 7,048,039 B2
(45) Date of Patent: *May 23, 2006

(54) CTE-MATCHED HEAT PIPE

(75) Inventor: David Sarraf, Elizabethtown, PA (US)

(73) Assignee: Thermal Corp., Stanton, DE (US)

( * ) Notice: Subject to any disclaimer, the term of this patent is extended or adjusted under 35 U.S.C. 154(b) by 55 days.

This patent is subject to a terminal disclaimer.

(21) Appl. No.: 10/924,586

(22) Filed: Aug. 24, 2004

(65) Prior Publication Data
US 2005/0082043 A1 Apr. 21, 2005

Related U.S. Application Data

(63) Continuation of application No. 10/458,168, filed on Jun. 10, 2003, now Pat. No. 6,793,009.

(51) Int. Cl.
*F28D 15/00* (2006.01)

(52) U.S. Cl. ............................ 165/104.21; 165/104.33; 165/104.26; 361/700; 361/697; 174/15.2; 257/714

(58) Field of Classification Search ............ 165/104.33, 165/104.21, 80.3, 185; 361/699, 700; 257/714–716; 174/15.2
See application file for complete search history.

(56) References Cited

U.S. PATENT DOCUMENTS

| | | | |
|---|---|---|---|
| 3,852,806 | A | 12/1974 | Corman et al. |
| 4,214,406 | A | 7/1980 | Wittmann et al. |
| 4,693,306 | A | 9/1987 | Nilson |
| 4,836,275 | A | 6/1989 | Sakaya et al. |
| 5,216,580 | A * | 6/1993 | Davidson et al. ........... 361/700 |
| 5,582,242 | A | 12/1996 | Hamburgen et al. |
| 5,632,158 | A | 5/1997 | Tajima |
| 6,014,312 | A * | 1/2000 | Schulz-Harder et al. .... 361/699 |
| 6,070,656 | A | 6/2000 | Dickey |
| 6,450,250 | B1 | 9/2002 | Guerrero |
| 2002/0080582 | A1 | 6/2002 | Chang |
| 2003/0066628 | A1 | 4/2003 | Mochizuki et al. |

FOREIGN PATENT DOCUMENTS

JP 60-42593 3/1985

* cited by examiner

*Primary Examiner*—Terrell McKinnon
(74) *Attorney, Agent, or Firm*—Duane Morris LLP

(57) ABSTRACT

A heat pipe having a mounting surface with a coefficient of thermal expansion matching that of silicon is disclosed, the heat pipe including a base containing aluminum nitride, a metal body, and a metal wick.

21 Claims, 4 Drawing Sheets

CTE-MATCHED HEAT PIPE

This application is a continuation application of U.S. application Ser. No. 10/458,168, filed on Jun. 10, 2003, and now issued as U.S. Pat. No. 6,793,009.

FIELD OF THE INVENTION

The present invention relates to a heat pipe having a mounting surface whose coefficient of thermal expansion (CTE) matches, or nearly matches that of silicon.

BACKGROUND OF THE INVENTION

It is known that certain classes of semiconductor devices consume substantial amounts of power, which then must be conducted away from the device and dissipated as waste heat. This heat is typically conducted through a variety of thermal interfaces, heat spreaders, and structural elements in the device's internal package, prior to being captured and rejected by an external heat sink. Since heat is most typically dissipated to room temperature air, and the silicon constructed semiconductor has a finite upper bound on its operating temperature, this package resistance is becoming a limiting factor in the ability to dissipate the waste heat.

The removal of package elements and interfaces will reduce the remaining package thermal resistance, and allow the device to either run cooler or dissipate more power. However, many of these elements are required in order to provide a match between the relatively low coefficient of thermal expansion (CTE) of silicon and the relatively high CTE of the metal comprising the heat sink, rather than for best thermal performance. This match needs to be maintained in order to prevent build-up of stress, as well as subsequent damage due to and failure of the relatively brittle silicon component. Thus, there are the competing structural requirements of layer of material to provide a CTE match while at the same time needing to bring the heat transfer structure into intimate physical contact with the heat generating structure.

Matching may be achieved by at least two methods: the use of an alloy substrate such as copper/tungsten whose CTE matches or nearly matches that of the silicon, or through the use of a ductile braze alloy between the silicon and the remaining package elements. Either method prevents transmission of stresses due to mismatched CTE through the interface to the silicon device. Some disadvantages of the alloy substrate include expense, unfavorable machining and stamping characteristics, and a fairly low thermal conductivity. Some disadvantages of the ductile braze alloy include a limited fatigue life, which eventually results in failure due to delamination of the joint. This tendency is enhanced by the service conditions of most high power devices. Such devices almost always operate under conditions of periodic fluctuating electrical load, which leads to periodic fluctuations in thermal load and mechanical stresses in the joint.

An alternative method involves the use of direct bond copper (DBC) aluminum nitride (AlN) in sheet form. This material is a "sandwich" comprised of a single layer of aluminum nitride and two outer layers of OFE copper foil. The copper layers are first oxidized, and then pressed against the AlN at high temperature in a neutral atmosphere. This process causes the oxide to diffuse into the AlN and bonds the copper sheets tightly to the AlN inner layer. Since the copper layers are relatively thin and are in an annealed state due to the high processing temperature, the CTE of the resulting assembly is largely governed by that the of the AlN.

None of the foregoing techniques have been found to be completely satisfactory.

SUMMARY OF THE INVENTION

The present invention relates to a heat pipe having a mounting surface with a coefficient of thermal expansion matching that of silicon, the heat pipe comprising a base including aluminum nitride, a copper body, and a metal wick. The base preferably comprises a single inner layer of aluminum nitride and two outer layers of OFE copper foil.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DESCRIPTION OF THE PREFERRED EMBODIMENTS

Figure 1:
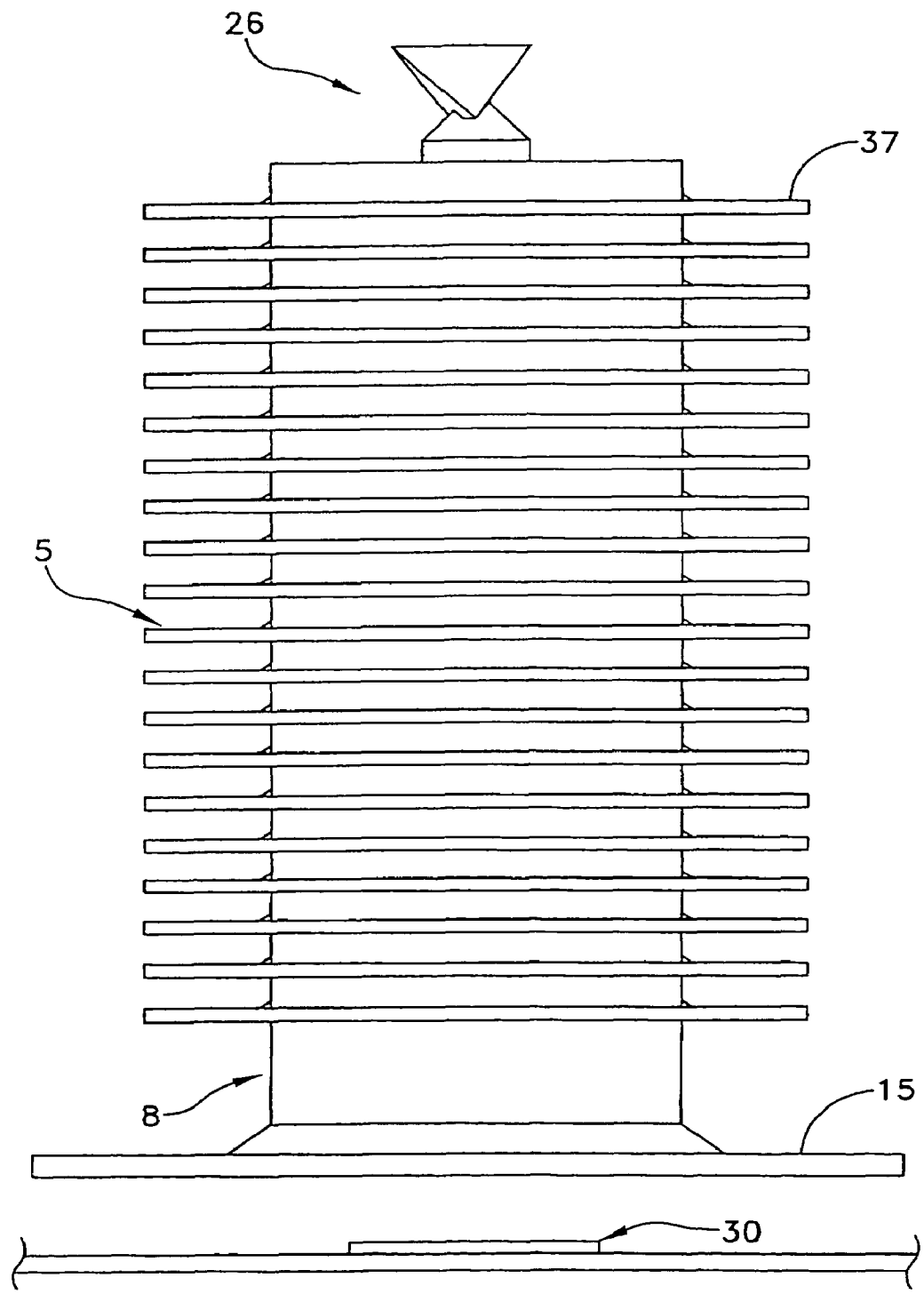
FIG. 1 is a perspective sectional view of a CTE-matched heat pipe of the present invention.
Figure 2:
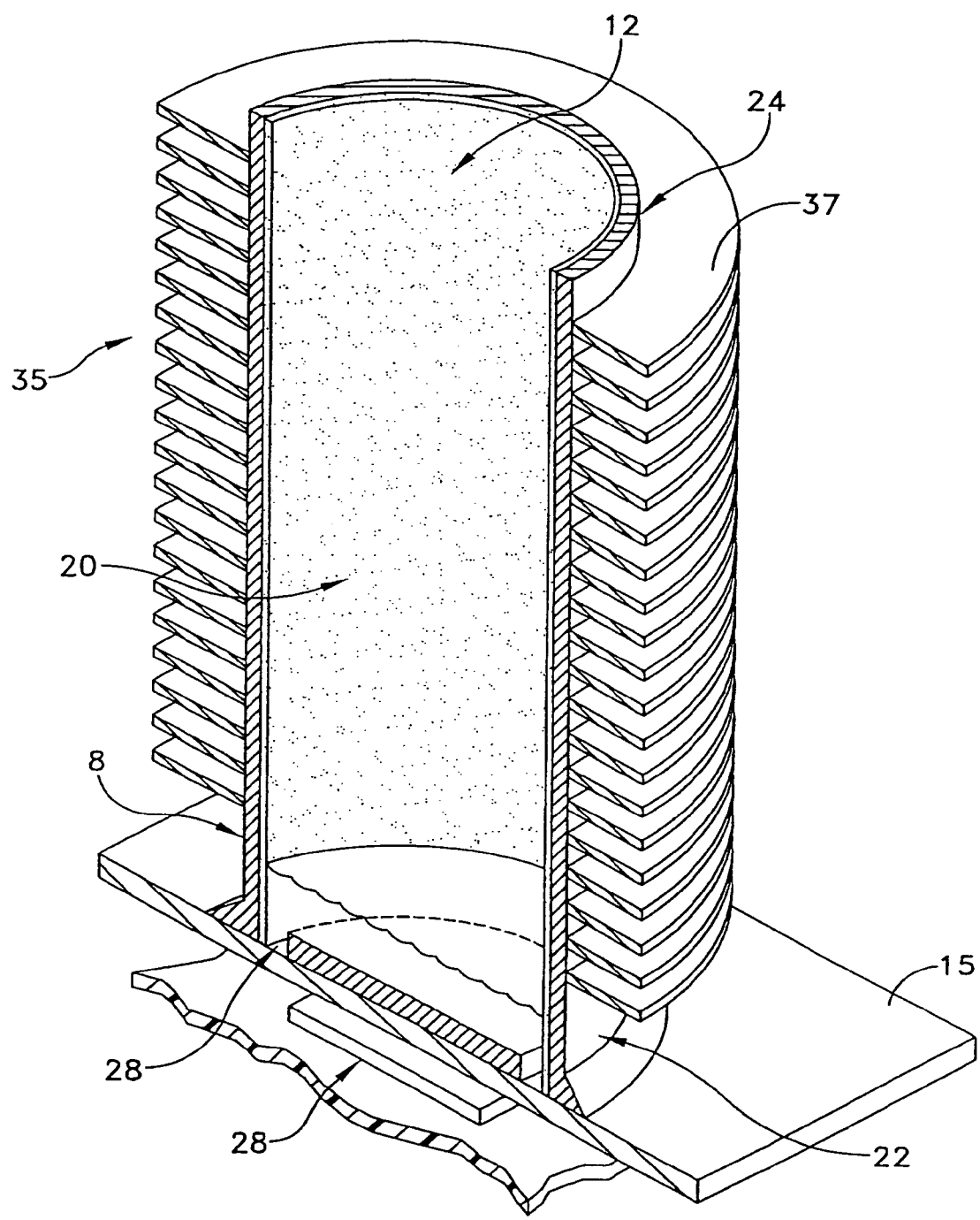
FIGS. 2–4 are cross-sectional views of the CTE-matched heat pipe of FIG. 1, including plate fins.
Figure 3:
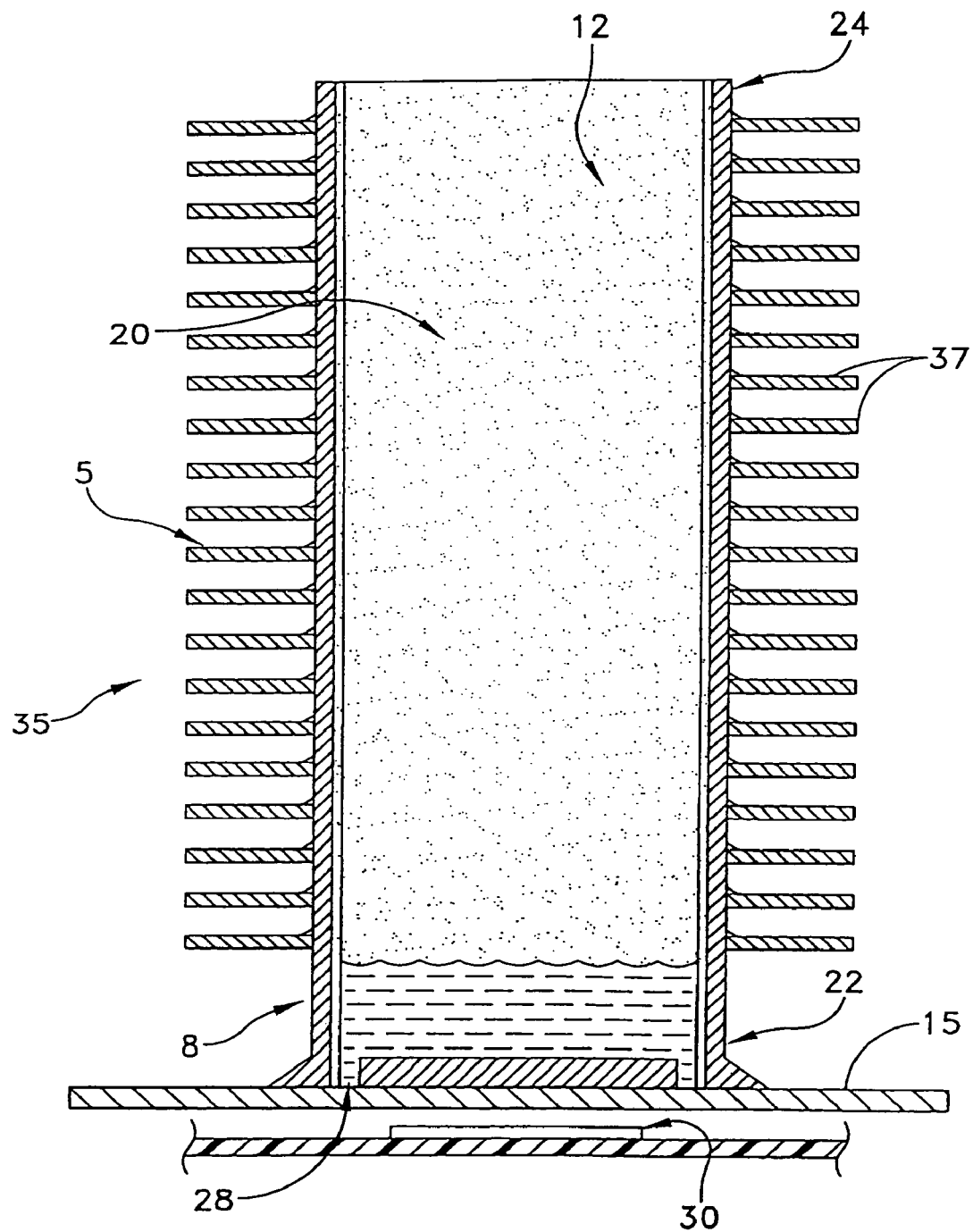
Figure 4:
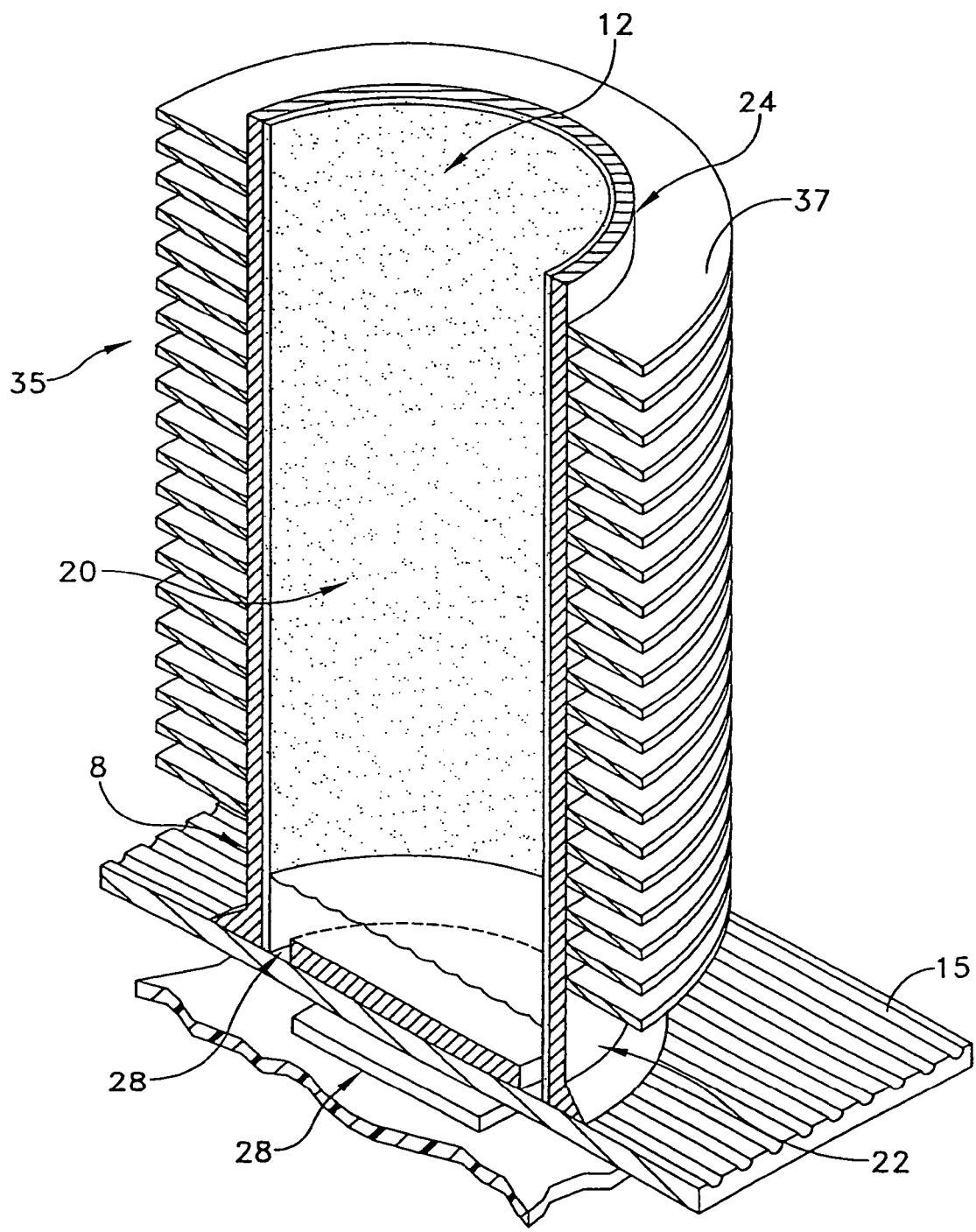

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Referring to FIGS. 1–4, a CTE-matched heat pipe 5 includes a body 8, a wick 12, a working fluid 13, and a base 15. More particularly, body 8 comprises a cylindrical tube formed from a highly thermally conductive metal, e.g., copper or its alloys, nickel or its alloys such as monel (an alloy of nickel and copper) could be incorporated into the structure with no significant changes in design or fabrication method. A vapor space is defined by a central passageway 20 extending along the longitudinal axis of body 8. Body 8 includes a bottom end 22 and a top end 24 that is pinched off or otherwise sealed at a fill tube 26 during construction. Wick 12 is preferably formed from a brazed copper powder that is distributed throughout the inner surface of body 8 that defines central passageway 20 at bottom end 22. Although not preferred, wick 12 may be distributed throughout the inner surface of body 8 that defines central passageway 20 at top end 22, and may also comprise adjacent layers of screening or a sintered powder structure with interstices between the particles of powder, having an average thickness of about 0.1 mm to 1.0 mm.

It should be noted that in the preferred embodiment of the present invention, no wick structure is present in top end 24 (the condenser region of heat pipe 5). This is due in large part to the fact that gravity will drive the return of condensed working fluid 13 in the particular orientation shown in FIGS. 1–4. A wick structure may be incorporated in top end 24, i.e., in the condenser region of heat pipe 5, in order to provide return of condensate when the evaporator portion of the heat pipe is oriented so as to be above the condenser region. A wick structure in top end 24 may also reduce the temperature drop associated with condensation, as well as improving performance of the device, even when the wick is not required to return the working fluid.

Wick 12 may also include a screen or grooves integral with the wall of body 8 that defines central passageway 20. Also, a plastic-bonded wick in the evaporator and condenser regions of heat pipe 5 may be produced simultaneously and as a contiguous structure after body 8 is brazed to base 15. This would provide a contiguous fluid conduit between the evaporator and condenser regions of heat pipe 5, which is advantageous when the evaporator is elevated. This feature may be met with a screen wick by "pushing" the screen wick into an annular gap 28 located between at bottom end 22 and base 15.

Working fluid 13 may comprise any of the well known two-phase vaporizable liquids, e.g., water, alcohol, freon, methanol, acetone, fluorocarbons or other hydrocarbons, etc. CTE-matched heat pipe 5 is formed according to the invention by drawing a partial vacuum within body 8, and then back-filling with a small quantity of working fluid 13, e.g., just enough to saturate wick 12 just prior to final sealing of body 8 by pinching, brazing, welding or otherwise hermetically sealing fill tube 26, once base 15 is mounted to bottom end 22 of body 8. The atmosphere inside heat pipe 5 is set by an equilibrium of liquid and vapor.

Base 15 is advantageously formed from a direct bond copper (DBC) aluminum nitride, and may comprise a variety of shapes that may be dictated by both the geometry of the underlying semiconductor device 30 to be cooled by CTE-matched heat pipe 5 and the shape of bottom end 22 of body 5. Base 15 is fastened directly to bottom end 22 of body 8 without the use of intermediate layers of CTE matching materials or ductile brazes. DBC aluminum nitride base 15 of the preferred embodiment of the present invention possesses several advantages that make it attractive for use as an interface to silicon semiconductors devices and substrates. As no interposing intermediate layers of CTE matching materials or ductile brazes are needed, bottom end 22 of CTE-matched heat pipe 5 will be arranged in intimate thermal communication with semiconductor device 30. The interface between bottom end 22 and semiconductor device 30 will also be significantly more resistant to thermal cycling and thermal fatigue. DBC aluminum nitride base 15 comprises high thermal conductivity, both in-plane and through-thickness, and its conductivity approaches that of aluminum. Thus, the construction of the present invention allows bottom end 22 of CTE-matched heat pipe 5 to approach the chip more closely, i.e., more closely than any method other than direct die contact or direct liquid cooling, so that the package thermal resistance is as low as possible.

In a further embodiment, a brazed wick may be formed on the inner surface of base 15. Depending on the heat load and particular power density, other wick structures may be appropriate. Examples of such structures include screen bonded to the input surface by spot-welding or brazing, a monolayer of powder metal, grooves cut in the copper layer of base 15, or an array of posts, either of the all-powder variety or solid copper which is powder covered, or brazed to the copper layer of the DBC aluminum nitride. Furthermore, it is also anticipated that a plastic-bonded wick may be substituted for the brazed copper wick.

In practice, semiconductor 30 is mounted to the bottom surface of base 15. Heat from semiconductor 30 is conducted through base 15 into bottom end 22 of heat pipe 5. The heat causes working fluid in wick 12 to evaporate. The vapor travels through central passageway 20 to a condenser region 35 of body 8. At condenser 35, the vapor contacts the walls of body 8 that define central passageway 20, condenses, and gives up its latent heat through condensation. Working fluid 12 then returns to bottom end 22 by either gravity, or through capillary action of a portion of wick 12 on the inner surface of body 8 that defines central passageway 20 at condenser 35.

As shown in FIG. 1, fins 37 or other suitable extended surfaces may be mounted to body 8 at condenser region 35 to convey the heat to the ambient environment. It is anticipated that other fin types and structures are possible, including a folded fin wrapped around a cylindrical heat pipe envelope, an array of plate fins mounted radially around the condenser, or an array of fins mounted to the top of the device.

It is to be understood that the present invention is by no means limited only to the particular constructions herein disclosed and shown in the drawings, but also comprises any modifications or equivalents within the scope of the claims.

What is claimed is:

1. A heat pipe comprising a tubular body having a central passageway, an evaporator portion defining said central passageway and having an evaporator end edge, and a wick disposed on at least said evaporator portion of said tubular body, a working fluid, and a base sealingly attached to said end edge thereby sealing off said evaporator portion of said tubular body wherein said base includes aluminum nitride, an interior surface communicating with said central passageway and a mounting surface that is sized and shaped to be directly mounted to at least one silicon device.

2. The heat pipe according to claim 1 wherein said base further includes direct bond copper.

3. The heat pipe according to claim 1 wherein said wick is a brazed copper powder metal wick.

4. The heat pipe according to claim 1 wherein said body comprises copper.

5. The heat pipe according to claim 1 wherein said at least one silicon device include one or more semiconductors.

6. The heat pipe according to claim 5 wherein said semiconductors are mounted to a bottom surface of said base.

7. The heat pipe according to claim 6 wherein heat from said semiconductors is conducted directly through said base.

8. The heat pipe according to claim 7 wherein said a portion of said wick contains a working fluid.

9. The heat pipe according to claim 8 wherein said heat results in the evaporation of said working fluid.

10. The heat pipe according to claim 1 wherein said base further includes a wick structure on an inner surface that is arranged in fluid communication with said wick disposed upon at least an evaporator portion of said central passageway.

11. The heat pipe according to claim 1 wherein said base is spaced away from said wick disposed upon at least an evaporator portion of said central passageway.

12. The heat pipe according to claim 1 wherein said working fluid is selected from the group consisting of water, methanol, acetone, fluorocarbons and hydrocarbons.

13. The heat pipe according to claim 1 further comprising a secondary heat sink mounted to said body.

14. A heat pipe comprising a tubular body having a central passageway, an evaporator portion defining said central passageway and an evaporator end edge, a first wick disposed on at least said evaporator portion of said tubular body, a working fluid, and a base comprising direct bond copper aluminum nitride and having an outer surface and an inner surface, wherein said inner surface is arranged in sealing relation to said evaporator end edge and includes a second wick and said outer surface is sized and shaped to be directly mounted to at least one silicon device.

15. The heat pipe according to claim 14 wherein said second wick comprises a plurality of grooves in said inner surface.

16. The heat pipe according to claim 14 wherein said second wick comprises a sintered metal powder positioned upon said inner surface.

17. The heat pipe according to claim 14 wherein said second wick comprises a screen mesh mounted to said inner surface.

18. The heat pipe according to claim 14 wherein said first wick comprises a brazed copper powder metal and said second wick comprises a sintered metal powder positioned upon said inner surface.

19. The heat pipe according to claim 18 wherein said at least one silicon device include one or more semiconductors.

20. The heat pipe according to claim 20 wherein heat from said semiconductors is conducted to and directly through said base.

21. The heat pipe according to claim 14 wherein said second wick is spaced away from said body and said first wick is arranged in fluid communication with said second wick.

* * * * *